(12) United States Patent
Ziglioli

(10) Patent No.: US 10,121,720 B2
(45) Date of Patent: Nov. 6, 2018

(54) SEMICONDUCTOR DEVICE, CORRESPONDING APPARATUS AND METHOD

(71) Applicant: STMICROELECTRONICS S.R.L., Agrate Brianza (IT)

(72) Inventor: Federico Giovanni Ziglioli, Pozzo d'adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/617,561

(22) Filed: Jun. 8, 2017

(65) Prior Publication Data

US 2018/0190564 A1    Jul. 5, 2018

(30) Foreign Application Priority Data

Jan. 3, 2017  (IT) .............................. AU2017A0033

(51) Int. Cl.
*H01L 23/373*  (2006.01)
*H01L 23/367*  (2006.01)
(Continued)

(52) U.S. Cl.
CPC ........ *H01L 23/3675* (2013.01); *H01L 21/288* (2013.01); *H01L 21/32055* (2013.01); *H01L 21/4875* (2013.01); *H01L 21/565* (2013.01); *H01L 23/315* (2013.01); *H01L 23/3114* (2013.01); *H01L 23/373* (2013.01); *H01L 23/49513* (2013.01); *H01L 23/49541* (2013.01); *H01L 23/552* (2013.01); *H01L 24/32* (2013.01); *H01L 24/48* (2013.01); *H01L 24/73* (2013.01);
(Continued)

(58) Field of Classification Search
CPC . H01L 23/3675; H01L 23/373; H01L 23/315; H01L 23/3114
See application file for complete search history.

(56) References Cited

U.S. PATENT DOCUMENTS 7,432,586 B2  10/2008  Zhao et al.
7,872,277 B2   1/2011  Hsu et al.
(Continued)

FOREIGN PATENT DOCUMENTS

CN    102881667 A    1/2013
CN    204367303 U    6/2015
(Continued)

OTHER PUBLICATIONS

Shen et al. "Ultrathin Flexible Graphene Film: An Excellent Thermal Conducting Material with Efficient EMI Shielding" *Advanced Functional Materials* 24:4542-4548, 2014.
(Continued)

*Primary Examiner* — Fei Fei Yeung Lopez
(74) *Attorney, Agent, or Firm* — Seed Intellectual Property Law Group LLP

(57) ABSTRACT

A semiconductor device, such as a semiconductor power device, includes: a semiconductor die having a semiconductor die front surface, a package formed onto the semiconductor die, the package having a portion facing the front surface of the semiconductor die, and a thermally-conductive layer including graphene over the front portion of the package facing the front surface of the semiconductor die.

19 Claims, 4 Drawing Sheets

(51) Int. Cl.
*H01L 23/31* (2006.01)
*H01L 23/552* (2006.01)
*H01L 23/495* (2006.01)
*H01L 21/56* (2006.01)
*H01L 21/3205* (2006.01)
*H01L 21/288* (2006.01)
*H01L 21/48* (2006.01)
*H01L 23/00* (2006.01)

(52) U.S. Cl.
CPC ............ *H01L 2224/32245* (2013.01); *H01L 2224/48091* (2013.01); *H01L 2224/48175* (2013.01); *H01L 2224/73265* (2013.01)

(56) References Cited

U.S. PATENT DOCUMENTS

| | | | |
|---|---|---|---|
| 8,263,843 B2 | 9/2012 | Kim et al. | |
| 8,704,341 B2 | 4/2014 | Lin et al. | |
| 9,646,906 B2 | 5/2017 | Cook et al. | |
| 2002/0167800 A1 | 11/2002 | Smalc | |
| 2003/0178719 A1* | 9/2003 | Combs | H01L 23/3128 257/704 |
| 2004/0016913 A1 | 1/2004 | Sognefest et al. | |
| 2005/0061496 A1 | 3/2005 | Matabayas, Jr. | |
| 2005/0280139 A1* | 12/2005 | Zhao | H01L 23/24 257/704 |
| 2007/0053166 A1 | 3/2007 | Hwang et al. | |
| 2007/0267734 A1* | 11/2007 | Zhao | H01L 21/561 257/687 |
| 2007/0278632 A1 | 12/2007 | Zhao et al. | |
| 2009/0212418 A1 | 8/2009 | Gurrum et al. | |
| 2010/0085713 A1 | 4/2010 | Balandin et al. | |
| 2012/0285673 A1 | 11/2012 | Cola et al. | |
| 2013/0020716 A1 | 1/2013 | Kuczynski et al. | |
| 2013/0221511 A1 | 8/2013 | Higgins, III et al. | |
| 2013/0299140 A1 | 11/2013 | Ling et al. | |
| 2013/0307128 A1 | 11/2013 | Lin et al. | |
| 2014/0070393 A1 | 3/2014 | Bartley et al. | |
| 2014/0160682 A1 | 6/2014 | Ben Jamaa et al. | |
| 2014/0287239 A1 | 9/2014 | Scurati et al. | |
| 2014/0353816 A1 | 12/2014 | Yap et al. | |
| 2017/0058176 A1* | 3/2017 | Chou | C09K 5/14 |

FOREIGN PATENT DOCUMENTS

| | | |
|---|---|---|
| EP | 2213756 A1 | 8/2010 |
| WO | 02081190 A1 | 10/2002 |
| WO | 2007063309 A1 | 6/2007 |
| WO | 2016/049650 A1 | 3/2016 |

OTHER PUBLICATIONS

Definition of "Adjacent", Merriam-Webster, https://www.merriam-webster.com/dictionary/adjacent, accessed on Nov. 13, 2017, 3 pages.

Shahil et al., "Graphene-Multilayer Graphene Nanocomposites as Highly Efficient Thermal Interface Materials," Jan. 2012, Nano Letters, vol. 12, pp. 861-867.

Huang et al., "Toward Effective Synergetic Effects from Graphene Nanoplatelets and Carbon Nanotubes on Thermal Conductivity of Ultrahigh Volume Fraction Nanocarbon Epoxy Composites," Oct. 22, 2012, J. Phys. Chem. C, vol. 116, pp. 23812-23820.

Italian Search Report and Written Opinion for IT VI2013A000077 dated Jan. 7, 2014 (10 pages).

Goyal et al., "Thermal Properties of the Hybrid Graphene-Metal Nano-Micro-Composites: Applications in Thermal Interface Materials," Applied Physics Letters 100, 073113, American Institute of Physics, Feb. 17, 2012, 4 pages.

* cited by examiner

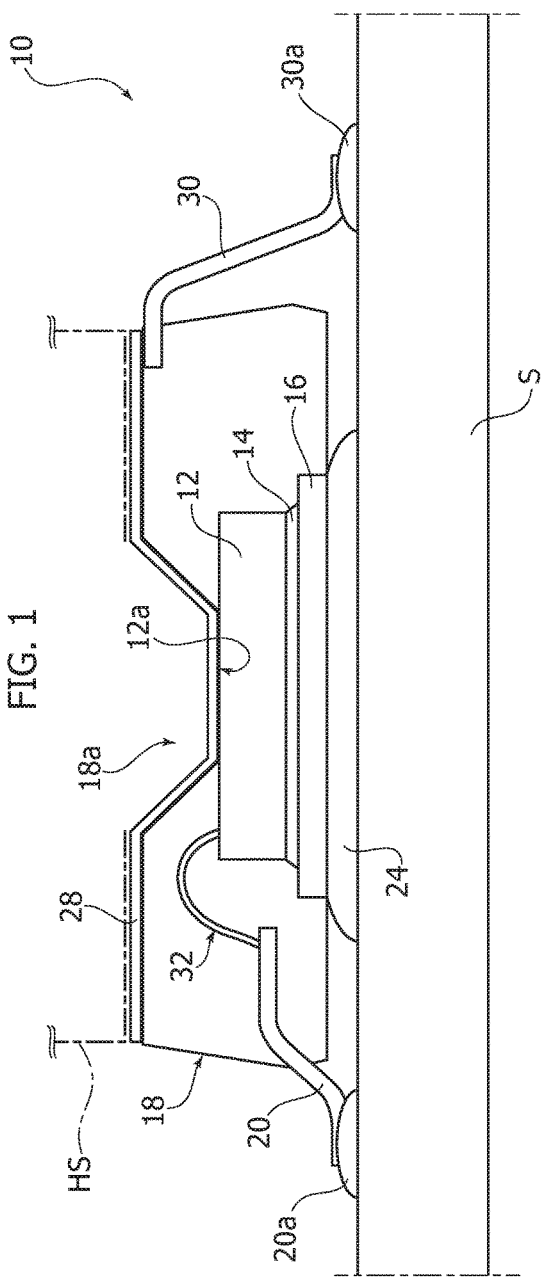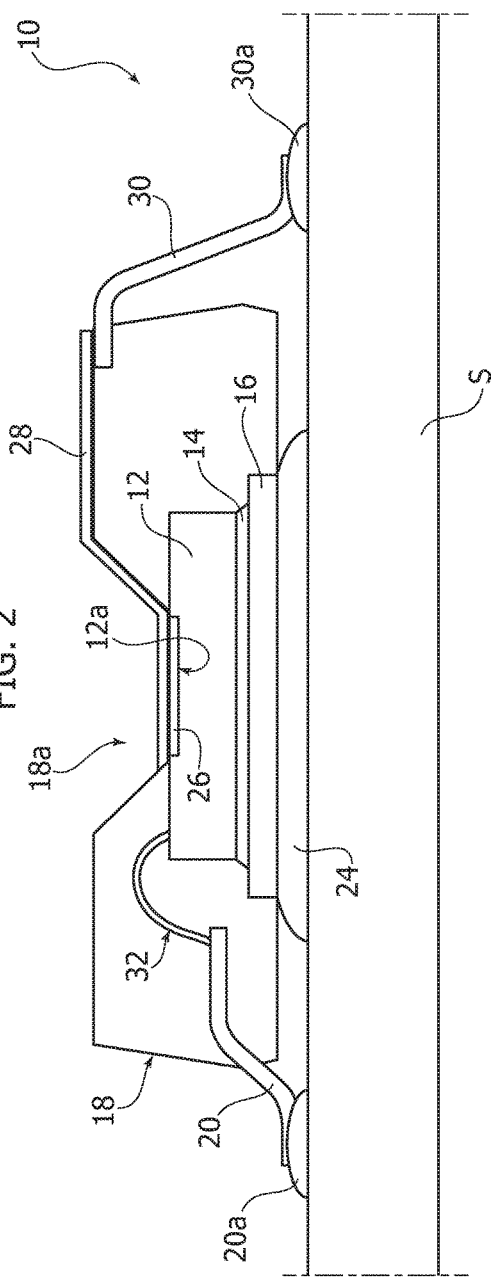

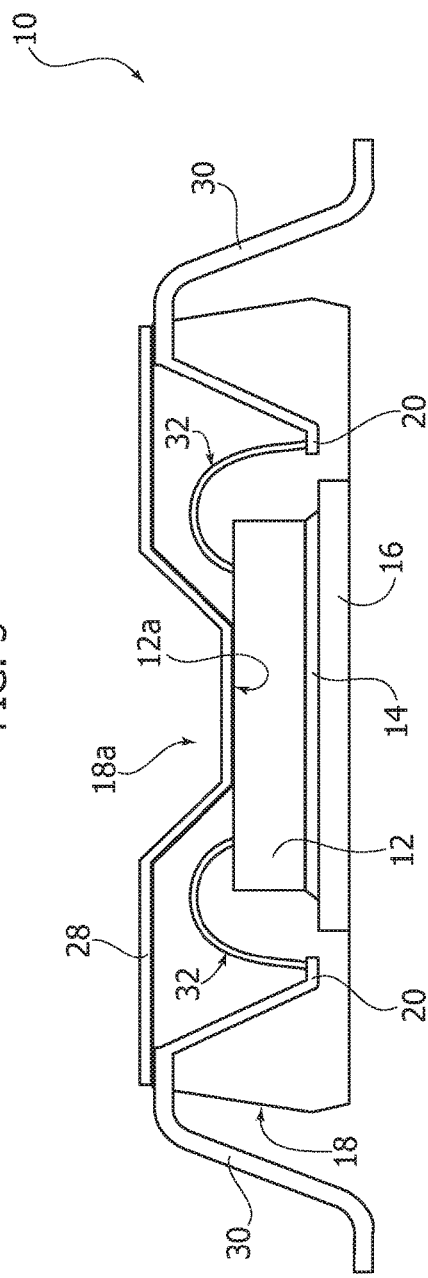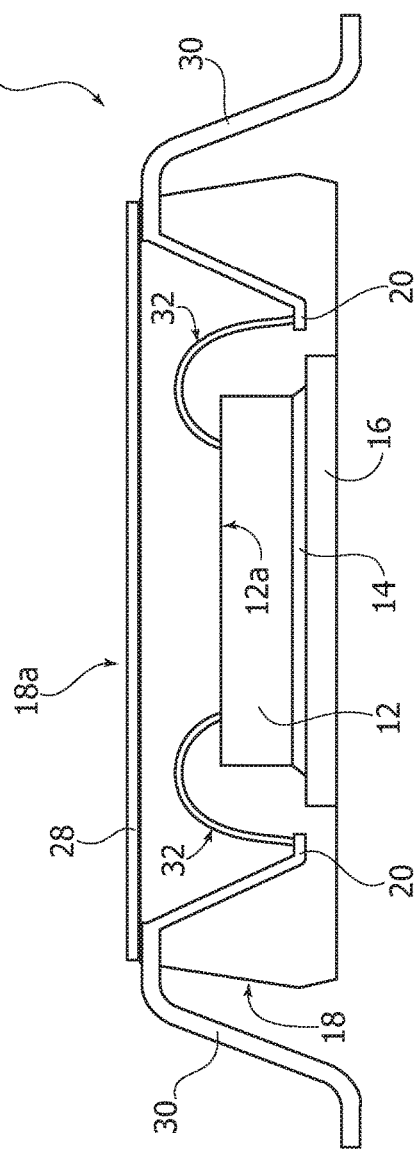

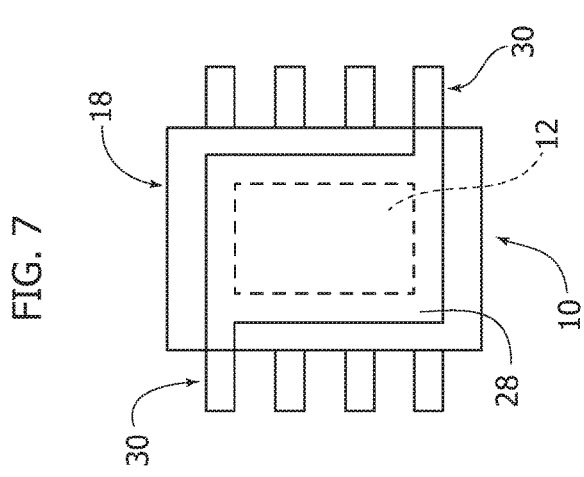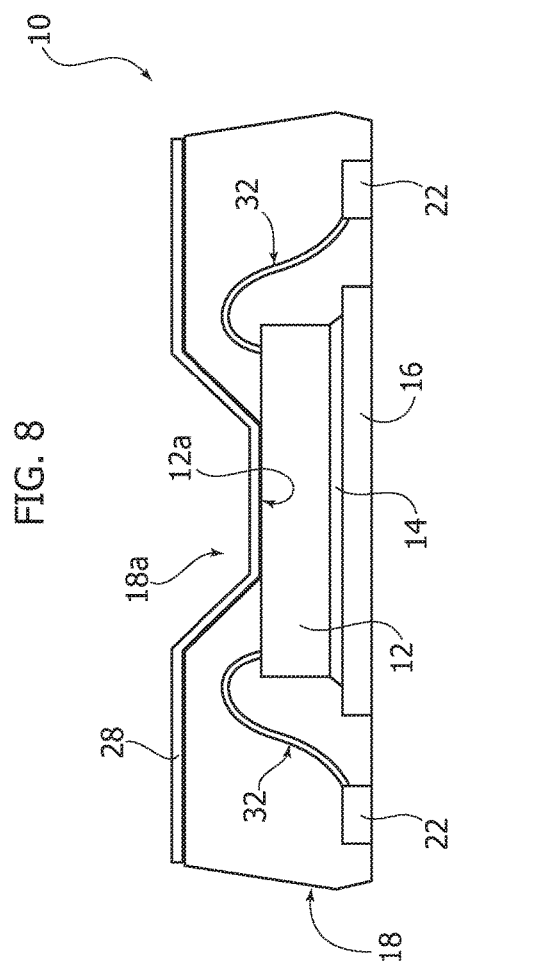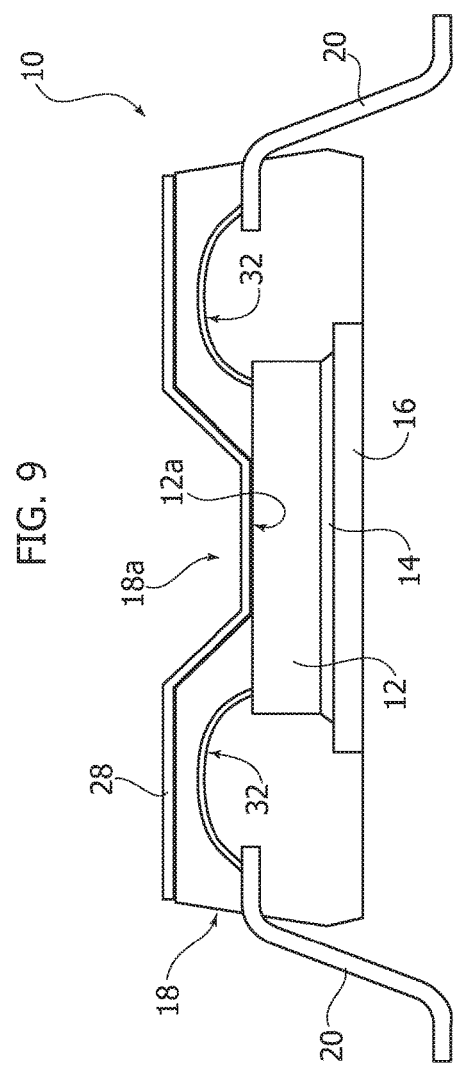

SEMICONDUCTOR DEVICE, CORRESPONDING APPARATUS AND METHOD

BACKGROUND

Technical Field

The description relates to semiconductor devices, such as, e.g., integrated circuits (ICs).

Description of the Related Art

Thermal dissipation may play a role in devising packaging for semiconductor devices such as power devices.

Thermal dissipation may involve using (large) heat sinks and/or thick metal layers which may give rise to cost and reliability issues.

The possibility of achieving low-cost and small dimension EMI (ElectroMagnetic Interference) shielding may be another factor deserving attention.

Documents such as U.S. Pat. Pub. No. 2013/0221511 A1 or U.S. Pat. Pub. No. 2013/0307128 A1 are exemplary of solutions of forming semiconductor die assemblies with heat spreaders and/or semiconductor packages with thermal dissipation structures and EMI shielding.

Graphene is an allotrope of carbon which may give rise to a bi-dimensional honeycomb structure exhibiting various interesting characteristics such as, e.g., thermal conductivity.

Graphene fillers in an organic (e.g., polymeric) matrix are being deployed for various applications such as conductive inks, thermal interface materials (TIMs), barrier layers, shielding layers, encapsulants and electrically conductive adhesives.

Such applications may include graphene flakes or graphene nano-platelets (GNP) in mono- or multi-layer form, as fillers in a composite system.

For instance, U.S. Pat. Pub. No. 2014/0287239 A1 discloses an integrated circuit chip attachment in a micro structure device accomplished through the use of an adhesive-based material in which graphene flakes are incorporated.

Also, CN 204367303 U discloses a plastic packaging mold mounted with a graphene cooling thin film in a plastic packaging process.

BRIEF SUMMARY

Despite a fairly extensive activity in that area a demand is still felt for improved solutions, e.g., in connection with semiconductor power devices.

One or more embodiments are directed to a semiconductor device, a corresponding apparatus (e.g., an application apparatus including one or more semiconductor devices mounted on a support such as a Printed Circuit Board—PCB), and a corresponding method. One or more embodiments may be applied, e.g., to QFN (Quad-Flat No-Leads), routed QFN integrated circuits (ICs) and the like. The claims are an integral part of the disclosure of the invention as provided herein.

BRIEF DESCRIPTION OF THE SEVERAL VIEWS OF THE DRAWINGS

One or more embodiments will now be described by way of non-limiting example with reference to the annexed figures, wherein:

FIGS. 1 and 2 are cross-sectional views exemplary of one or more embodiments,

FIGS. 5 and 6 are cross-sectional views exemplary of one or more embodiments,

FIG. 7 is a plan view of one or more embodiments, and

FIGS. 8 and 9 are cross-sectional views exemplary of one or more embodiments

Figure 3:
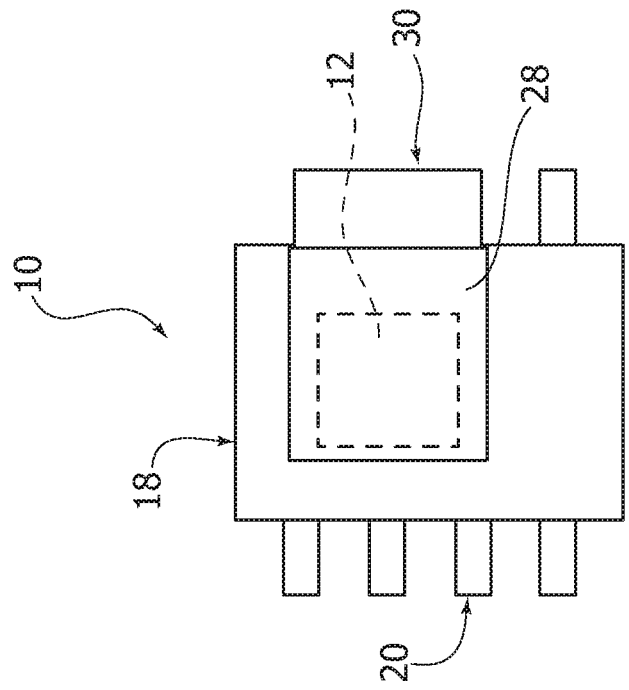
FIGS. 3 and 4 are plan views of one or more embodiments.

It will be appreciated that for the sake of clarity and simplicity, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

In the figures, reference number 10 denotes as a whole a semiconductor device which, in one or more embodiments, may be mounted on a support substrate S such as, e.g., a Printed Circuit Board (PCB).

A semiconductor power device may be exemplary of such a device. One or more embodiments may include, e.g., a QFN (QuadFlat No-Leads), routed QFN circuit possibly including a sacrificial substrate.

In one or more embodiments (and according to a general structure which is known per se) the device 10 may include a semiconductor die (or "chip") 12 mounted, e.g., with an interposed thermally-conductive layer 14 (e.g., a glue, soft solder or tape), onto a die pad 16. The semiconductor die 12 is made from a semiconductor material, such as silicon, and includes an active surface in which one or more electrical components are formed. Also, a package 18 including, e.g., plastic material such as a Package Molding Compound (PMC), may be provided on the semiconductor die 12, the interposed thermally-conductive layer 14, and the die pad 16.

Electrically conductive leads 20 or pads 22 (FIG. 9) may provide electrical connection of the semiconductor die 12 with electrically conductive lines, e.g., provided on the support substrate S. In one or more embodiments, this may occur, e.g., via contact formations, such as those designated 20a.

In one or more embodiments as exemplified in FIGS. 1 and 2 a Thermal Interface Material (TIM) layer 24 may be provided, e.g., in order to facilitate heat transfer (and possibly power supply) between the semiconductor die 12 and the substrate S.

In one or more embodiments, a front or top surface of the package 18 (e.g., opposite to the substrate S) may be provided with a recessed portion 18a. This may result in a front or top area 12a of the semiconductor die 12 being either exposed to the package surface (see, e.g., FIG. 1) or lying in (strict) vicinity thereto (see, e.g., FIG. 2, where an electrical connection 26 may be provided over at least a portion of the surface 12a, e.g., for high power supply).

In one or more embodiments (see, e.g., FIG. 6) a recessed portion 18a may not be provided so that a front or top area 12a of the semiconductor die 12 may be located at a distance from the front or top surface of the package 18.

In one or more embodiments a graphene layer 28 may be provided extending over the front (top) surface of the package 18, e.g., over the recessed portion 18a, if provided.

In one or more embodiments, as exemplified, e.g., in FIG. 1, the graphene layer 28 may extend over a substantial portion (e.g., almost the entirety) of the front surface of the package 18.

Figure 4:
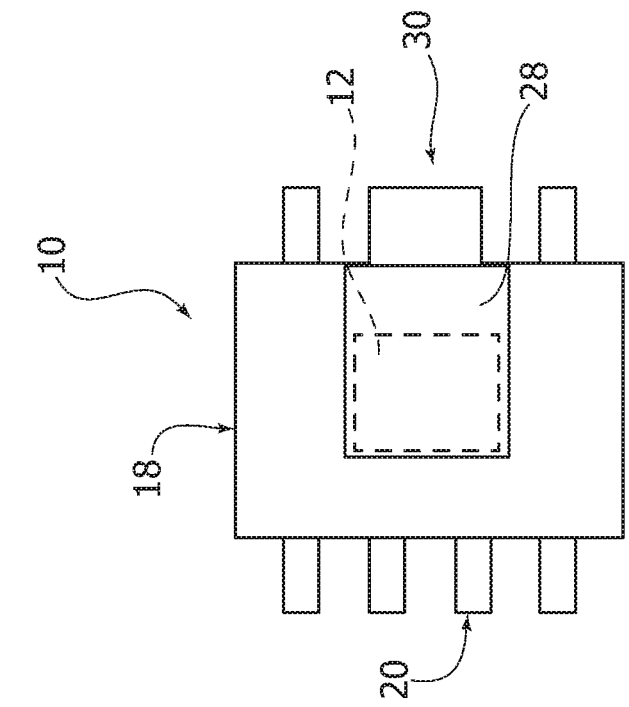

In one or more embodiments, as exemplified in FIG. 2 and in the (top) plan views of FIGS. 3 and 4, the graphene layer 28 may extend over just a portion of the front or top surface of the package 12.

In one or more embodiments, as exemplified in FIGS. 1 to 3 and 5-6, the graphene layer may extend in the recessed portion 18a of the package 18 to extend in contact with (see, e.g., FIG. 1) and/or in close vicinity (see, e.g., FIG. 2) of the front surface 12a of the semiconductor die 12.

In one or more embodiments, as exemplified in FIG. 6, the front surface of the package 18 may be substantially flat so that the graphene layer 28 may extend at a certain distance from the front surface 12a of the semiconductor chip or die 12.

In one or more embodiments, the graphene layer 28 may be provided by printing a graphene-based ink (e.g., an ink including graphene flakes or graphene nano-platelets GNP).

In one or more embodiments, the graphene-based ink may be subjected (e.g., after drying and/or sintering) to compression. In that way a graphene-based layer exhibiting a thickness of 30-50 micron (1 micron=$10^{-6}$ m) thickness may be compressed into a layer having a thickness of, e.g., 5-10 micron (1 micron=$10^{-6}$ m).

The graphene layer 28 may provide enhanced thermal dissipation at the front (top) surface of the package.

In one or more embodiments, a (dedicated) heat sink (HS) may then be applied onto the layer 28 (as schematically represented in chain lines in FIG. 1) possibly after mounting the device 10 onto the substrate S.

In one or more embodiments, thermally-conductive (e.g., metal) formations 30 may be provided extending bridge-like between the layer 28 and the substrate S (e.g., at 30a) to provide thermal dissipation towards the substrate S.

The (top) plan views of FIGS. 3, 4 and 7 are exemplary of the possibility, in one or more embodiments, of providing the formations at different locations and/or with different shapes, e.g., in compliance with application specifications.

In one or more embodiments as exemplified in FIGS. 5 and 6 the formations 30 may be provided integral (one-piece) with the electrically conductive leads 20 with the ability of jointly providing electrical connection towards the semiconductor die 12 and thermal dissipation paths from the graphene layer 28.

In one or more embodiments, in addition to providing thermal dissipation paths for the graphene layer 28, formations such as the formations 30 may also provide ground connection of the graphene layer 28 thereby facilitating providing EMI shielding of the semiconductor die 12.

It will be appreciated that, in one or more embodiments as exemplified, e.g., in FIG. 6 such an EMI shielding effect by the graphene layer 28 (e.g., via ground pad formations 30) may be facilitated even if the graphene layer 28 extends at a certain distance from the front surface 12a of the semiconductor die 12.

FIGS. 8 and 9 are exemplary of the possibility, in one or more embodiments, of combining the provision of the graphene layer 28 with conventional wire bonding 32 between the semiconductor die 12 and the leads or pads 20, 22.

In one or more embodiments, printing of the graphene layer 28 may be, e.g., via screen printing, with ink smearing that has to be maintained within acceptable tolerances for the intended application.

Also, it will be appreciated that features of one or more embodiments exemplified herein with reference to each one of the FIGS. 1 to 9 may be applied—individually or in combination—to one or more embodiments exemplified in the other figures.

One or more embodiments may thus provide a semiconductor device (e.g., 10), including:
  a semiconductor die (or "chip," e.g., 12) having a semiconductor die (front or top) surface (e.g., 12a),
  a package (e.g., 18) formed onto the semiconductor die, the package having a (front or top) portion (e.g., 18a) facing said surface of the semiconductor die, and
  a thermally-conductive layer (e.g., 28) over said portion of the package facing said surface of the semiconductor die, the thermally-conductive layer including graphene.

In one or more embodiments, said portion of the package may include a recessed portion (e.g., 18a) of the package.

In one or more embodiments, the thermally-conductive layer including graphene may extend in contact with (see, e.g., FIG. 1) or in the vicinity of (see, e.g., FIG. 2) said surface of the semiconductor die at said recessed portion.

One or more embodiments may include at least one thermally-conductive member (e.g., 30) extending from the package, the at least one thermally-conductive member in thermal exchange relationship with the thermally-conductive layer including graphene.

In one or more embodiments the thermally-conductive layer including graphene may be extended over the package, wherein the thermally-conductive layer including graphene provides an electromagnetic interference (EMI) shield for the semiconductor die.

One or more embodiments may include a die mounting pad (e.g., 16) for the semiconductor die, with said surface of the semiconductor die located opposite the die mounting pad.

One or more embodiments may include a heat sink (e.g., HS) arranged in thermal exchange relationship with the thermally-conductive layer including graphene.

One or more embodiments may regard apparatus including:
  a support substrate (e.g., a PCB) for semiconductor devices,
  at least one semiconductor device according to one or more embodiments on said support substrate (e.g., S), the apparatus optionally including electrically and/or thermally-conductive formations (e.g., 20, 30) extending between the thermally-conductive layer including graphene and said support substrate.

A method of manufacturing a semiconductor device according to one or more embodiments may include providing the thermally-conductive layer including graphene by printing a graphene-containing ink onto said package.

One or more embodiments may include applying compression to said graphene-containing ink printed onto said package.

Without prejudice to the underlying principles, the details and the embodiments may vary, even significantly, with respect to what has been described by way of example only, without departing from the extent of protection. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
a semiconductor die having a surface;
a conductive member having first and second ends;
a package material formed on the semiconductor die, the package material having a top surface, the first end of the conductive member being on the top surface of the package material, wherein the second end is outside of the package material; and
a thermally-conductive layer contacting the top surface of the package material and the first end of the conductive member, the thermally-conductive layer facing the surface of the semiconductor die, the thermally-conductive layer including graphene.

2. The semiconductor device of claim 1, wherein the package material includes a recessed portion and the thermally-conductive layer is located in the recessed portion.

3. The semiconductor device of claim 2, wherein the thermally-conductive layer is in contact with or in the vicinity of the surface of the semiconductor die at the recessed portion.

4. The semiconductor device of claim 1, wherein the conductive member is a thermally-conductive member.

5. The semiconductor device of claim 1, wherein the thermally-conductive layer covers a majority of the top surface of the package material, wherein the thermally-conductive layer provides an electromagnetic interference shield for the semiconductor die.

6. The semiconductor device of claim 1, comprising a die mounting pad coupled to the semiconductor die and configured to support the semiconductor die.

7. The semiconductor device of claim 1, comprising a heat sink arranged in thermal exchange relationship with the thermally-conductive layer.

8. An apparatus, comprising: a support substrate; and at least one semiconductor package including: a semiconductor die; a molding compound covering at least a portion of the semiconductor die; a conductive member having a first end on a top surface of the molding compound and a second end configured to be coupled to another device outside of the molding compound; and a thermally-conductive layer contacting the molding compound and the first end of the conductive member, the thermally-conductive layer including graphene.

9. The apparatus of claim 8, wherein the molding compound includes a recess at a surface of the semiconductor die, the thermally-conductive layer covering the molding compound and the surface of the semiconductor die at the recess.

10. The apparatus of claim 8, wherein the molding compound includes a recess that exposes the semiconductor die, the thermally-conductive layer abutting the semiconductor die in the recess.

11. The apparatus of claim 8, comprising a plurality of conductive members having first ends on the top surface of the molding compound and second ends configured to be coupled to another device, the thermally-conductive layer on the first ends of the plurality of conductive members.

12. The apparatus of claim 8, wherein the thermally-conductive layer covers a majority of the top surface of the molding compound.

13. A method comprising: forming a semiconductor package that includes a package material that encapsulates at least partially a semiconductor die, the semiconductor package including a conductive member having a first end on a top surface of the package material and a second end arranged laterally with respect to the package material and outside of the package material; and forming a thermally-conductive layer including graphene contacting the top surface of the package material and the first end of the conductive member.

14. The method of claim 13, wherein forming the thermally-conductive layer comprises printing a graphene-containing ink on the top surface of the package material and the first end of the conductive member.

15. The method of claim 14, comprising after printing the graphene-containing ink on the top surface of the package material, compressing the graphene-containing ink.

16. The method of claim 13, wherein forming the semiconductor package includes forming the semiconductor package to having a recess in the package material, the recess facing a surface of the semiconductor die.

17. The method of claim 16, wherein forming the thermally-conductive layer comprises forming a conformal layer over a surface of the semiconductor package that includes the recess of the package.

18. The method of claim 15, wherein forming the thermally-conductive layer comprises printing a thermally-conductive ink on a majority of the top surface of the package material.

19. The method of claim 15, comprising coupling a heat sink to the thermally-conductive layer.

* * * * *

UNITED STATES PATENT AND TRADEMARK OFFICE
CERTIFICATE OF CORRECTION

PATENT NO. : 10,121,720 B2
APPLICATION NO. : 15/617561
DATED : November 6, 2018
INVENTOR(S) : Federico Giovanni Ziglioli Page 1 of 1

It is certified that error appears in the above-identified patent and that said Letters Patent is hereby corrected as shown below:

On the Title Page

Item (30) Foreign Application Priority Data:
"AU2017A0033" should read --102017000000485--

Signed and Sealed this
Sixteenth Day of July, 2019

Andrei Iancu
*Director of the United States Patent and Trademark Office*